(12) United States Patent
Yamamoto

(10) Patent No.: US 8,274,087 B2
(45) Date of Patent: Sep. 25, 2012

(54) NITRIDE SEMICONDUCTOR SUBSTRATE AND MANUFACTURING METHOD OF THE SAME

(75) Inventor: Shunsuke Yamamoto, Hitachi (JP)

(73) Assignee: Hitachi Cable Ltd., Toyko (JP)

( * ) Notice: Subject to any disclaimer, the term of this patent is extended or adjusted under 35 U.S.C. 154(b) by 156 days.

(21) Appl. No.: 12/619,972

(22) Filed: Nov. 17, 2009

(65) Prior Publication Data

US 2010/0295055 A1 Nov. 25, 2010

(30) Foreign Application Priority Data

May 21, 2009 (JP) .................................. 2009-123018

(51) Int. Cl.
*H01L 29/20* (2006.01)

(52) U.S. Cl. .................. 257/76; 257/E29.089; 257/103; 257/615

(58) Field of Classification Search .................. 257/76, 257/103, E29.089, 615
See application file for complete search history.

(56) References Cited

U.S. PATENT DOCUMENTS

| 6,667,184 | B2 | 12/2003 | Motoki et al. |
| 6,924,159 | B2 | 8/2005 | Usui et al. |
| 2002/0197825 | A1 | 12/2002 | Usui et al. |
| 2003/0080345 | A1 | 5/2003 | Motoki et al. |
| 2004/0221799 | A1* | 11/2004 | Nakayama et al. ............. 117/94 |
| 2007/0176199 | A1* | 8/2007 | Shibata ......................... 257/103 |
| 2007/0261633 | A1* | 11/2007 | Tanaka .......................... 117/952 |

FOREIGN PATENT DOCUMENTS

| JP | 11-251253 A | 9/1999 |
| JP | 2003-165799 A | 6/2003 |
| JP | 2003-178984 A | 6/2003 |
| JP | 2004-356609 A | 12/2004 |
| JP | 2007-184352 A | 7/2007 |

* cited by examiner

*Primary Examiner* — Marc Armand
(74) *Attorney, Agent, or Firm* — Martin Fleit; Paul D. Bianco; Fleit Gibbons Gutman Bongini & Bianco PL

(57) ABSTRACT

To improve an adhesion to a substrate holder, and improve a device production yield by uniformizing a temperature distribution in a surface of a substrate and uniformizing characteristics such as a film thickness. When a concave warpage is set to be negative on a substrate front side, and a convex warpage is set to be positive on the substrate front side, then a line segment is drawn from one end of a substrate rear surface to the other end of the substrate rear surface, passing through a substrate center line, and a substrate is sliced by this line segment in a substrate thickness direction, a maximum value of shortest values of a distance from an arbitrary point on the drawn line segment to a rear side outline in a sliced surface, is defined as warpage H in a diameter direction, and when the warpage H in the diameter direction is obtained in a substrate peripheral direction, with its maximum value set to be Hmax, and its minimum value set to be Hmin, the warpage H in the diameter direction is defined to satisfy Hmax−Hmin≦30 μm.

8 Claims, 7 Drawing Sheets

NITRIDE SEMICONDUCTOR SUBSTRATE AND MANUFACTURING METHOD OF THE SAME

BACKGROUND

1. Technical Field

The present invention relates to a nitride semiconductor substrate and a manufacturing method of the same, and particularly suitably relates to a gallium nitride substrate.

2. Description of Related Art

Group III-V nitride semiconductor materials such as gallium nitride (GaN), indium gallium nitride (InGaN), gallium aluminium nitride (GaAlN) have a sufficiently large forbidden band width, and an inter-band transition is a direct transition type. Therefore, examination is actively performed, regarding an application to a short-wavelength light emitting element. Also, application to an electronic element is also expected, because a saturation drift velocity of electrons is great, and 2-dimensional carrier gas by hetero-junction can be utilized.

A nitride semiconductor layer constituting these elements can be obtained by causing epitaxial growth on a base substrate, by using vapor-phase deposition methods such as a metal-organic vapor phase (MOVPE), a molecular beam epitaxy (MBE), and a hydride vapor phase epitaxy (HVPE). MOVPE and MBE are used in a case of obtaining mainly a thin film layer, and HVPE is used in a case of obtaining mainly a thick film layer. However, in the nitride semiconductor layer, there is no base substrate, with lattice constants matched with those of the nitride semiconductor layer. Therefore, it is difficult to obtain a high quality growth layer, and a plurality of crystal defects are contained in the obtained nitride semiconductor layer. The crystal defects are factors of inhibiting an improvement of element characteristics, and therefore examination has been actively performed heretofore, regarding reduction of the crystal defects in the nitride semiconductor layer.

As a method of obtaining a group III nitride crystal, with relatively less crystal defects, there is a method of forming a semiconductor multilayer film constituting an element part on a heterogeneous substrate, by using this heterogeneous substrate as a substrate for crystal growth. For example, a method of forming a low temperature deposition buffer layer on the heterogeneous substrate such as sapphire, and forming an epitaxial growth layer thereon, is known. In this crystal growth method using this low temperature deposition buffer layer, first, AlN or GaN is deposited on the substrate such as sapphire at around 500° C., and an amorphous film or a continuous film partially containing polycrystal is formed. The formed film is partially evaporated or crystallized by increasing a temperature to around 1,000° C., to thereby form a crystal nucleus with high density. If this crystal nucleus is grown as a nucleus of growth, a GaN film with relatively improved crystallinities can be obtained. In this case, the heterogeneous substrate such as sapphire remains as it is. However, even when the method for forming this low temperature deposition buffer layer is used, tremendous degree of crystal defects such as threading dislocations and vacancy exist in the obtained GaN film, and therefore it is insufficient in this method, to obtain an element having high performance which is desired at present.

In view of the above-described circumstance, a method for forming a semiconductor multilayer film constituting an element part on a GaN substrate by using this GaN substrate as a substrate for crystal growth, is actively examined. The GaN substrate for crystal growth is called a GaN freestanding substrate. However, as a method for obtaining the GaN freestanding substrate, ELO (Epitaxial Lateral Overgrowth: for example, see patent document 1) technique is known. The ELO method is a technique of obtaining the GaN layer with less dislocations by forming a mask having an opening part on the base substrate, and making the crystal laterally grown from this opening part. Patent document 1 proposes a technique of forming the GaN layer on a sapphire substrate by using this ELO method, then removing the sapphire substrate by etching, etc, to thereby obtain the GaN freestanding substrate.

As a method obtained by further developing the ELO method, FIERO (Facet-Initiated Epitaxial Lateral Overgrowth: for example, see non-patent document 2) method has been developed. The FIELO method shares a technique in common with the ELO method, in a point that selective growth is carried out by using a silicon oxide mask. However, this is a method for changing a propagating direction of the dislocations by forming a facet in a mask opening part during the selective growth, to thereby reduce the threading dislocations that reach an upper surface of the epitaxial growth layer. If the GaN thick layer is grown on the base substrate such as sapphire and thereafter the base substrate is removed, a high quality GaN freestanding substrate with less crystal defects can be obtained.

Also, as a method for obtaining the GaN freestanding substrate with low dislocations, DEEP (Dislocation Elimination by the Epi-growth with Inverted-Pyramidal Pits: for example see patent document 2) method is developed. By the DEEP method, GaN is grown, with silicon nitride patterned on not the sapphire substrate but the GaAs substrate as a mask, to thereby form a plurality of pits surrounded by a facet surface intentionally on a crystal surface, and the dislocations are accumulated in a bottom part of the pits. Whereby, the other area is low-dislocated.

In the aforementioned ELO method and DEEP method, crystal is grown, with the facet surface exposed to a crystal growth interface, at an initial time of the crystal growth. If the facet surface exists, an advancing direction of the propagated dislocations during crystal growth is likely to be curved. By utilizing such a behavior, the dislocations are set so as not to reach the crystal surface. Thus, the dislocation density on the substrate surface can be lowered. Further, when the crystal is grown on the crystal growth interface while producing the pits surrounded by the facet, the dislocations are accumulated with high dense on the bottom of the pit. When the dislocations are accumulated, mutually collapsed dislocations disappear, or an action such as stopping an advancement of the dislocations to a surface works by forming a dislocation loop. Thus, the dislocation density can be more effectively reduced.

PATENT DOCUMENT

Patent Document 1
Japanese Patent Laid Open Publication No. 11-251253
Patent Document 2
Japanese Patent Laid Open Publication No. 2003-165799

NON-PATENT DOCUMENT

Non-Patent Document 1
Ok-Hyun Nam et al., Appl. Phys. Lett. 71 (18) 1997, pp. 2638-2640.
Non-Patent Document 2
A. Uui, et, al., Jpn. J. Appl. Phys. Vol. 40 (2001) pp. L140-L143.

The GaN freestanding substrate is used as a substrate by separating or removing the crystal which is epitaxyally-grown thick on the heterogeneous substrate, after growth. Therefore, it is absolutely difficult to suppress generation of the dislocations low, in the vicinity of an interface of heteroepitaxial growth at initial time of the crystal growth. Accordingly, it is necessary that the dislocations generated with high density are reduced during thick film epitaxial crystal growth, becoming a substrate, and finally the substrate surface is made to have low dislocations. Therefore, methods for reducing dislocations such as the aforementioned ELO method, FIELO method, and DEEP method, are devised.

However, in the GaN freestanding substrate obtained by these methods, a difference in dislocation density is generated in a thickness direction toward a front surface from a rear surface, on the substrate after crystal is grown, which is epitaxially-grown thick on the heterogeneous substrate. Therefore, the lattice constants are varied in the thickness direction, thus allowing warpage to generate in the substrate. Therefore, the substrate takes a non-uniform warpage shape.

By using such a substrate having a non-uniform warpage shape, the substrate is fitted to a substrate holder for epitaxially-growing the crystal on the substrate surface by using an MOVPE apparatus having a layer structure for a device. However, a substrate rear surface can not be tightly adhered to the substrate holder, due to the warpage of the substrate. Therefore, a temperature distribution is generated in the substrate, and as a result, a uniform-film thickness distribution can not be obtained in the epitaxial film formed on the substrate surface.

By using the substrate holder having the warpage shape equivalent to that of the rear surface of the substrate, adhesion between the substrate holder and the substrate is improved, and it is theoretically possible to achieve a uniform temperature distribution. However, in manufacturing the substrate holder with high dimension accuracy, most of the substrate holders have a uniform warpage shape symmetrical with respect to a center, and it is extremely difficult to manufacture the substrate holder having the non-uniform warpage shape, with high accuracy. Therefore, when non-uniformity of the warpage shape of the substrate is great, the substrate holder and the substrate rear surface are not adhered to each other, in a case of the substrate holder having the uniform warpage shape symmetrical with respect to the center, thus allowing a non-uniform temperature distribution to be generated and the uniform film thickness distribution can not be obtained. Further, even if the substrate holder having the non-uniform warpage shape equivalent to that of the substrate rear surface can be manufactured with high accuracy, there is a problem that cost is incurred in manufacture, and further the substrate holder must be exchanged within the specific number of times, due to deterioration of the substrate holder in each growth, thus incurring much cost.

Note that this problem is involved not only in the GaN freestanding substrate, but also in other nitride semiconductor substrate.

An object of the present invention is to provide a nitride semiconductor substrate and a manufacturing method of the same, capable of improving adhesion to the substrate holder, thus uniformizing a temperature distribution in the surface of a substrate, and uniformizing characteristics such as a film thickness, in a case of causing epitaxial growth on the nitride semiconductor substrate.

SUMMARY OF THE INVENTION

As a result of strenuous efforts by inventors of the present invention, the present invention is achieved by obtaining a knowledge that an adhesion between a substrate holder and a nitride semiconductor substrate is improved in a case that the substrate holder is fitted to the nitride semiconductor substrate and causing epitaxial growth thereon, when a parameter such as a warpage in a diameter direction is newly introduced to the warpage of a substrate, then a maximum value and a minimum value of the warpage in the diameter direction are obtained over an entire surface of a substrate rear surface, and a value (maximum value−minimum value) is set to be a specific value or less, and a uniform warpage of the substrate holder symmetrical with respect to a center of a holder is set to be an average value of the warpage in the diameter direction of the substrate over the entire surface of the substrate.

The nitride semiconductor substrate of the present invention can be achieved by the following means.

According to a first aspect of the present invention, there is provided a nitride semiconductor substrate, wherein when a concave warpage is set to be negative on a substrate front side, and a convex warpage is set to be positive on the substrate front side, then a line segment is drawn from one end of a substrate rear surface to the other end of the substrate rear surface, passing through a substrate center line, and a substrate is sliced by this line segment in a substrate thickness direction, a maximum value of shortest values of a distance from an arbitrary point on the drawn line segment to a rear side outline in a sliced surface, is defined as warpage H in a diameter direction, and when the warpage H in the diameter direction is obtained in a substrate peripheral direction, with its maximum value set to be Hmax, and its minimum value set to be Hmin, the warpage H in the diameter direction is defined to satisfy Hmax−Hmin≦30 μm.

Further, it is preferable that the warpage H in the diameter direction is defined so as to satisfy Hmax−Hmin≦20 μm.

Further, preferably the nitride semiconductor substrate is a GaN substrate.

Further, preferably the nitride semiconductor substrate is a GaN freestanding substrate.

Further, according to other aspect of the present invention, there is provided a manufacturing method of a nitride semiconductor substrate, for manufacturing a nitride semiconductor substrate in which when a concave warpage is set to be negative on a substrate front side, and a convex warpage is set to be positive on the substrate front side, then a line segment is drawn from one end of a substrate rear surface to the other end of the substrate rear surface passing through a substrate center line, and a substrate is sliced by this line segment in a substrate thickness direction, a maximum value of shortest values of a distance from an arbitrary point on the drawn line segment to a rear side outline in a sliced surface, is defined as warpage H in a diameter direction, and when the warpage H in the diameter direction is obtained in a substrate peripheral direction, with its maximum value set to be Hmax, and its minimum value set to be Hmin, the warpage H in the diameter direction is defined to satisfy Hmax−Hmin≦30 μm.

In this case, preferably the warpage H in the diameter direction satisfies Hmax−Hmin≦20 μm.

Further, preferably the nitride semiconductor substrate is a GaN substrate manufactured by growing a GaN crystal on a GaN base layer, and when the GaN crystal is grown, the warpage H in the diameter direction satisfies Hmax−Hmin≦30 μm, by controlling an initial nucleus density.

Further, preferably the nitride semiconductor substrate is the GaN substrate manufactured by growing the GaN crystal by supplying gas containing $NH_3$ gas and GaCl gas onto the GaN base layer, and the warpage H in the diameter direction is defined to satisy Hmax−Hmin≦30 μm, by uniformly spreading the GaCl gas in the surface of the GaN base layer.

Further, preferably the nitride semiconductor substarte is the GaN substrate manufactured by growing the GaN crystal by supplying gas containing $NH_3$ gas and GaCl gas onto the GaN base layer, and the warpage H in the diameter direction is defined to satisfy Hmax−Hmin≦30 μm by controlling a partial pressure ratio of $N_2$ gas and $H_2$ gas, being a carrier gas of the GaCl gas.

According to the present invention, the adhesion to the substrate holder can be improved, and a temperature distribution in the surface of the substrate can be uniformized, and also the characteristics such as a film thickness can be uniformized.

BRIEF DESCRIPTION OF THE DRAWINGS

FIG. 1 is an explanatory view showing a maximum value and a minimum value of a warpage in a diameter direction in a nitride semiconductor substrate according to an embodiment of the present invention, wherein FIG. 1A is a planar view showing a rear surface of the nitride semiconductor substrate indicated by outlines of the warpage, FIG. 1B is a perspective view showing a rear surface of the nitride semiconductor substrate indicated by outlines of the warpage, FIG. 1C is a warpage characteristic view in a diameter direction having a maximum value Hmin of the warpage in a radial direction, and FIG. 1D is a warpage characteristic view in the diameter direction having a minimum value Hmax of the warpage in the radial direction.

FIG. 3 is an explanatory view of the warpage of the nitride semiconductor substrate according to an embodiment of the present invention, wherein FIG. 3A is a schematic sectional view of the nitride semiconductor substrate having a concave warpage on the substrate front side, and FIG. 3B is a schematic sectional view of the nitride semiconductor substrate having a convex warpage on the substrate front side, respectively.

FIG. 6 is an explanatory view of a substrate holder formed into a face-down type according to an embodiment of the present invention, wherein FIG. 6A is a schematic sectional view of the substrate holder having the warpage with a shape adjusted to the substrate having the concave warpage, and FIG. 6B is a schematic sectional view of the substrate holder having the warpage with a shape adjusted to the substrate having the convex warpage.

DESCRIPTION OF PREFERRED EMBODIMENTS OF THE INVENTION

Preferred embodiments of the present invention will be described.

A nitride semiconductor substrate according to an embodiment of the present invention will be described.

As is already described, when a crystal film is grown by using a growth apparatus such as an MOVPE apparatus, on a substrate surface of a conventional nitride semiconductor substrate having a non-uniform warpage shape, a substrate rear surface is not adhered to a substrate holder due to a warpage of a substrate, and as a result, the surface of the substrate is not uniformly heated, thus failing to obtain a uniform film thickness.

According to an embodiment of the present invention, when warpage H in a diameter direction is obtained over a peripheral direction of the substrate and its maximum value is set to be Hmax, and its minimum value is set to be Hmin, the nitride semiconductor substrate is defined to have the warpage H in the diameter direction, satisfying Hmax−Hmin≦30 μm. This makes it possible to provide the nitride semiconductor substrate excellent in adhesion to the substrate holder, capable of uniformly heating the surface of the substrate by a growth apparatus, and further capable of uniformizing the characteristics such as a film thickness in the surface of the substrate. Thus, the characteristics are uniform in the surface of the substrate, and therefore a device production yield can be improved.

[Nitride Semiconductor Substrate]

The nitride semiconductor substrate is a freestanding substrate. In the nitride semiconductor substrate, a semiconductor composed of a compound of group III atom and nitrogen is preferable, and a semiconductor expressed by $In_xGa_yAl_{1-x+y}N$ (0≦x≦1, 0≦y≦1, 0≦x+y≦1) is more preferable. GaN and AlGaN are particularly preferable, from a viewpoint of satisfying strength and manufacturing stability.

[Definition of the Warpage]

(1) Definition of the Warpage

Figure 3:
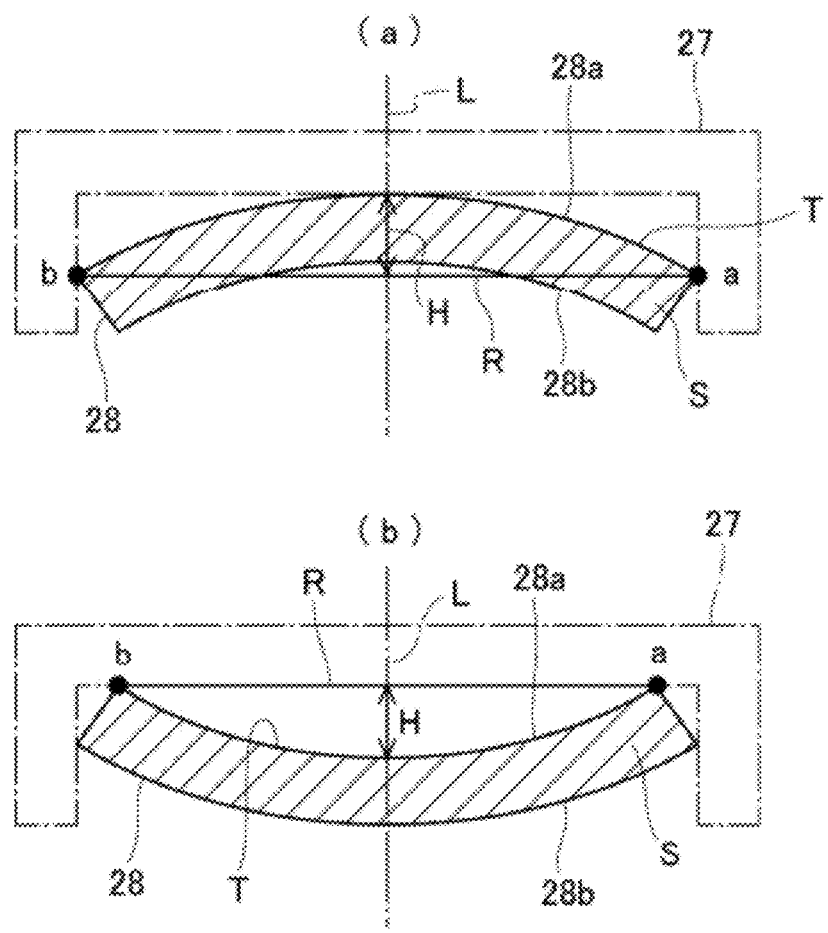

In the MOVPE method, there are face-up system and a face-down system. In the face-up system, the nitride semiconductor substrate is fixed to the substrate holder, with its crystal growth face (called a front surface hereinafter) faced upward. In the face-down system, the nitride semiconductor substrate is fixed to the substrate holder, with its front surface of the substrate faced downward. Here, explanation will be given, on the basis of the face-down system. FIG. 3 shows a definition of the warpage of the nitride semiconductor substrate.

Regarding the nitride semiconductor substrate shown in FIG. 3A, a nitride semiconductor 28 has a concave warpage on a substrate front surface 28b side. In this case, line segment R is drawn from one end "a" of a substrate rear surface 28a to the other end "b" of the substrate rear surface 28a, passing through substrate center line L extending in a substrate center in a thickness direction, and by this line segment R, the substrate 28 is sliced in a substrate thickness direction. At this time, a maximum value of shortest values of a distance from an arbitrary point on the drawn line R to rear side outline T in a sliced surface S, is marked with negative sign, minus, "−", and is defined as the warpage H in the diameter direction.

Further, regarding the nitride semiconductor substrate shown in FIG. 3B, the nitride semiconductor substrate 28 has a convex warpage on the substrate front surface 28b side. In this case, the line segment R is drawn from one end "a" of the substrate rear surface 28a to the other end "b" of the substrate rear surface 28a, passing through the substrate center line L, and the substrate 28 is sliced by this line segment R. At this time, a maximum value of shortest values of the distance from an arbitrary point on the drawn line segment R to the rear side outline T in the sliced surface S, is marked with positive sign, plus, "+", and is defined as the warpage H in the diameter direction.

As described above, the definition of the warpage in the diameter direction in the nitride semiconductor substrate 28 is common in concave/convex warpages. Moreover, even when the warpage of the substrate is not uniform, this definition can be applied.

(2) Maximum Value Hmax and Minimum Value Hmin of the Warpage in the Diameter Direction The warpage H in the diameter direction is obtained over a peripheral direction of the substrate. In order to obtain the warpage in the diameter direction over the substrate peripheral direction, a position of the one end "a" of the substrate rear surface 28a is moved at prescribed intervals until it turns half round, and at each point, the warpage H in each diameter direction is obtained. Obtained warpages in each diameter direction are compared, and the maximum warpage is set to be Hmax and the minimum warpage is set to be Hmin in surface of the substrate rear surface.

Figure 1:
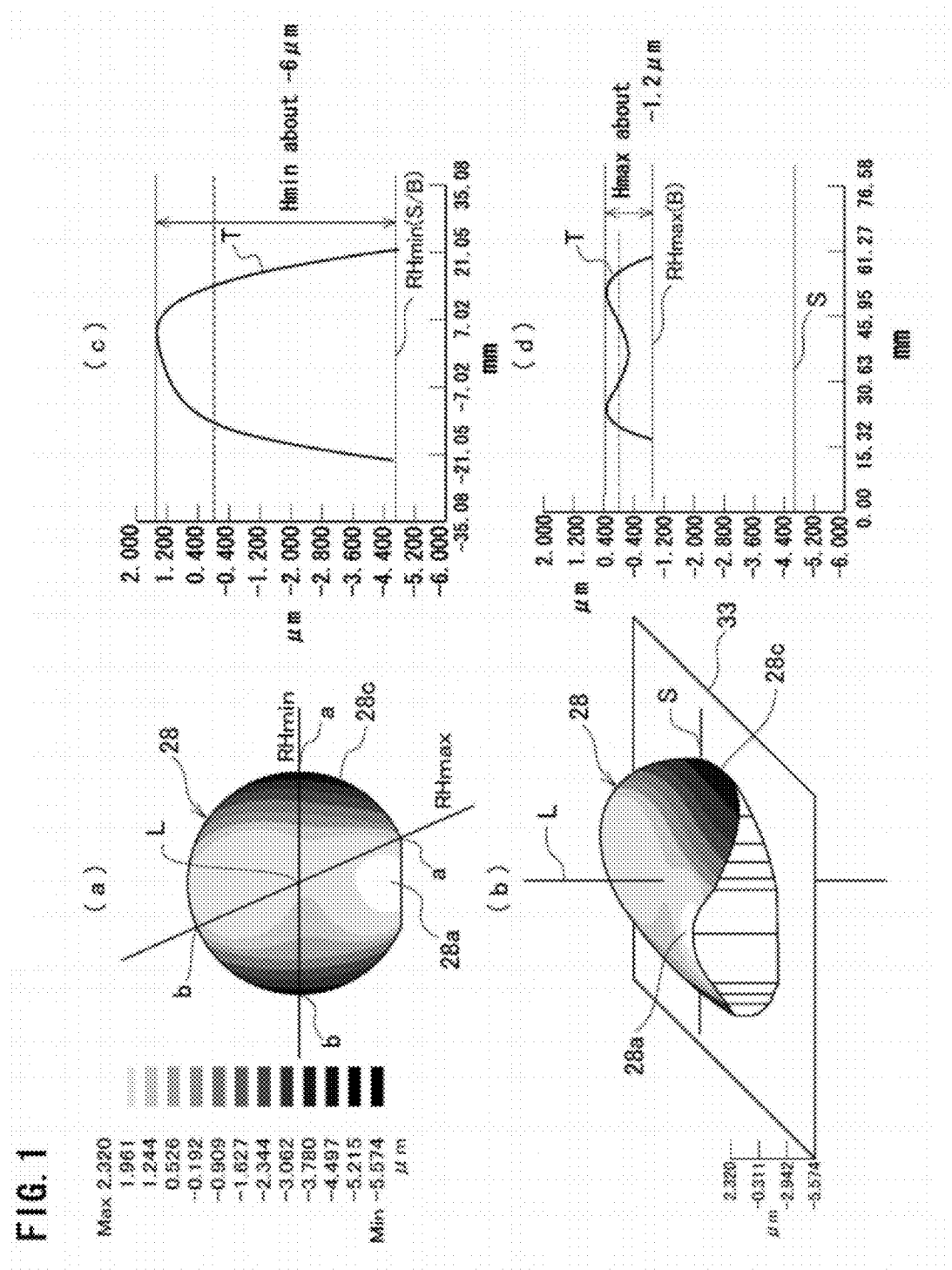

The nitride semiconductor substrate 28 shown in FIG. 1A and FIG. 1B has the concave warpage on the substrate front side, and has the convex warpage on the substrate rear side. The nitride semiconductor substrate 28 is placed on a flat surface 33 in a horizontal posture, with its rear surface 28a faced upward and its front surface faced downward. Line segment R is drawn in the substrate 28 which is placed horizontally on the flat surface 33, to thereby connect two points facing with each other on an outer peripheral end 28c. On the assumption that $R_{Hmin}$ and $R_{Hmax}$ shown in FIG. 1A are the line segments having Hmin and Hmax, the substrate 28 is sliced by these line segments $R_{Hmin}$ and $R_{Hmax}$. At this time, the rear side outline T in the sliced surface of the warpage of the substrate 28 is formed in a curved line as shown in FIG. 1C and FIG. 1D, respectively. In this case, Hmin is about −6 μm, and Hmax is about −1.2 μm. Note that in an example of FIG. 1D, two local maximum values are present, and these values are equal to each other. However, there is also a case that these values are different from each other. In addition, there is also a case that one local maximum value is present.

When the warpage of the substrate is uniform, the outer peripheral end of the substrate surface is totally brought into contact with the flat surface 33. Accordingly, in the line segment R drawn from an arbitrary direction, one end "a" of the substrate rear surface 28a and the other end "b" of the substrate rear surface 28a are brought into contact with the flat surface 33. However, when the warpage is not uniform, the one end "a" of the substrate rear surface 28a and the other end "b" of the substrate rear surface 28a are not brought into contact with the flat surface 33, and is floated from the flat surface 33 in some cases.

In a case of FIG. 1C showing the sectional view of the line segment $R_{Hmin}$ drawn from a direction having Hmin, one end "a" of the substrate rear surface 28a and the other end "b" of the substrate rear surface 28a are brought into contact with the flat surface 33. Accordingly, line segment $R_{Hmin}$ is present on the flat surface 33. Meanwhile, in a case of FIG. 1D showing the sectional view of the line segment $R_{Hmax}$ drawn from a direction having Hmax, one end "a" of the substrate rear surface 28a and the other end "b" of the substrate rear surface 28a are not brought into contact with the flat surface 33 and are floated. Therefore, line segment $R_{Hmax}$ in a vertical axial direction of FIG. 1D is not present on the flat surface 33, and is located at an upper position, compared with a case of the line segment $R_{Hmin}$ of FIG. 1C.

Absolute values of the maximum value Hmax and the minimum value Hmin indicate not a distance between a straight line (called a reference line S) on the flat surface 33 and the substrate rear surface, but a distance between a straight line (called a base bottom line B) passing between two faced points a, b on the substrate outer peripheral end passing through a substrate center line L and the substrate rear surface, namely, a distance in a height direction in a sectional face.

Figure 7:
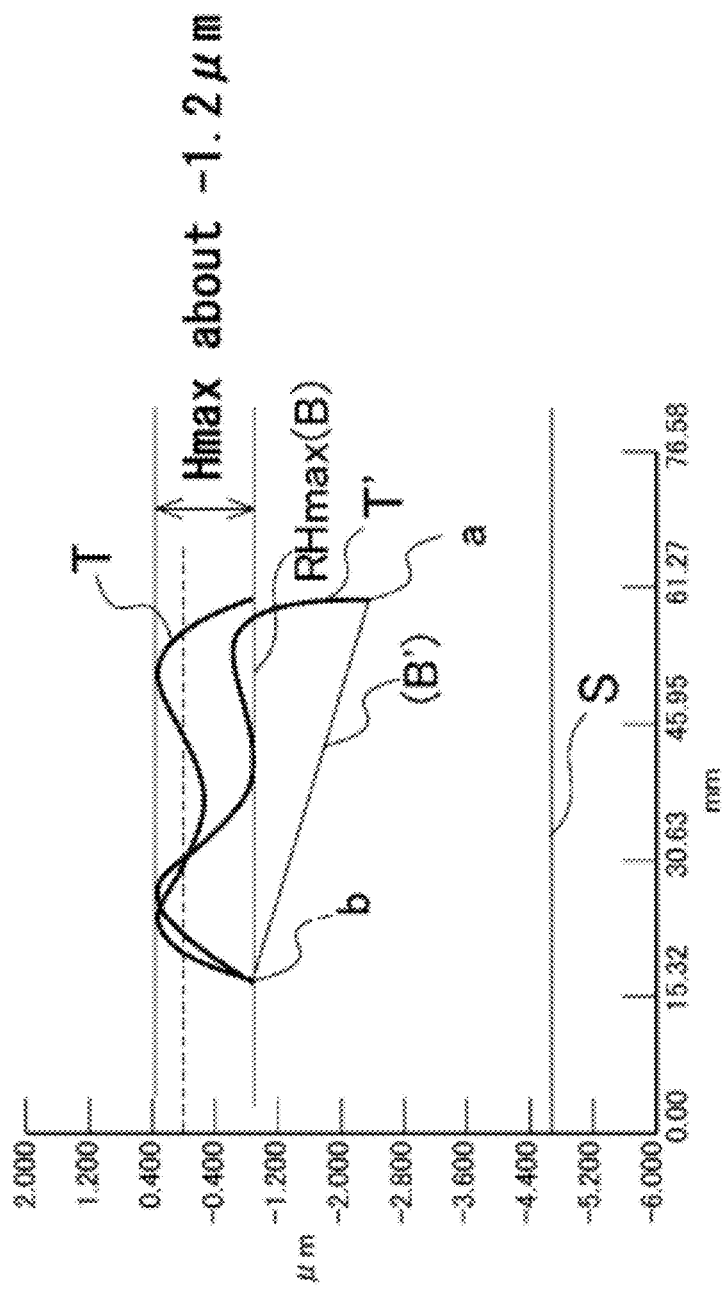
FIG. 7 is an explanatory view for obtaining the warpage in the diameter direction, when the sectional view on the coordinate of the nitride semiconductor substrate according to an embodiment of the present invention is inclined.

In this case, as shown in FIG. 1C and FIG. 1D, there is no problem when the base bottom line B is parallel to the reference line S. However, for example, as shown in FIG. 7, when the base bottom line B' is not parallel to the reference line S (flat surface 33), there is a problem in obtaining substrate rear side outline T' on the coordinate. This is because when the base bottom line B' is not parallel to the reference line S, a difference is generated in Hmax, between a case of obtaining the warpage in the diameter direction by drawing the line passing through one end "a" on the outer peripheral end of the substrate in parallel to the reference line S, and a case of obtaining the warpage in the diameter direction by drawing the line passing through the other end "b" on the outer peripheral end of the substrate in parallel to the reference line S. In this case, by rotating the sectional view on the coordinate so as not to allow such a difference to be generated in both cases, correction of making the base bottom line B' parallel to the reference line S is performed, and thereafter the warpage in the diameter direction is measured. Note that the same thing can be said for Hmin.

[Manufacturing Method of the Nitride Semiconductor Substrate]

A nitride semiconductor thin film is formed on a heterogeneous substrate, and further a nitride semiconductor thick film is formed, with this nitride semiconductor thin film as a base film, and the formed nitride semiconductor thick film is separated from the heterogeneous substrate, to thereby obtain the nitride semiconductor substrate. In the embodiment hereinafter, explanation will be given for a case that a nitride semiconductor is GaN.

(1) Substrate Manufacturing Method for a GaN Substrate According to an Embodiment As the heterogeneous substrate that can be used in the embodiment, any one of sapphire, SiC, $ZrB_2$, ZnO, $LiAlO_2$, $NdGaO_3$, GaAs, etc, is acceptable. In order to control an initial nucleus density, the substrate, with the nitride semiconductor thin film such as AlN and GaN epitaxially-grown on these heterogeneous substrates, is used.

In order to epitaxially-grow the GaN thin film, preferably the substrate surface is partially masked by a photolithography method and a VAS (void-assisted separation) method (Y. Oshima et al., Jpn. J. Appl. Phys., Vol. 42 (2003), pp. L1-L3). The VAS method is a method including the steps of forming a metal Ti thin film on the substrate after providing the GaN base layer; nitriding the metal Ti thin film by applying heat treatment thereto in an ammonia and hydrogen gas mixture flow, to thereby obtain a TiN thin film having a net-like structure; then creating a void by etching the GaN base layer; and growing the GaN layer through the TiN thin film having a net-like structure. The substrate obtained by the VAS method is called a "void formed substrate". Explanation will be given hereinafter on the basis of this void formed substrate.

(2) Crystal Growth Method of the GaN Substrate of the Present Invention

As a crystal growth method of the GaN substrate of this embodiment, a hydride vapor phase epitaxy (HVPE) using GaCl and $NH_3$ as raw materials is suitable. In the HVPE method, a crystal growing rate is great such as 100 μm/hour or more, and a thick GaN crystal film can be easily grown. After the initial nucleus is formed, a crystal film needs to be grown thick in many cases, to obtain a flat crystal surface. Therefore, it is particularly important that the growing rate is great. In order to respond to such a request, an HVPE growth apparatus is used.

(3) HVPE Growth Apparatus of the GaN Substrate (Freestanding Substrate)

Figure 4:
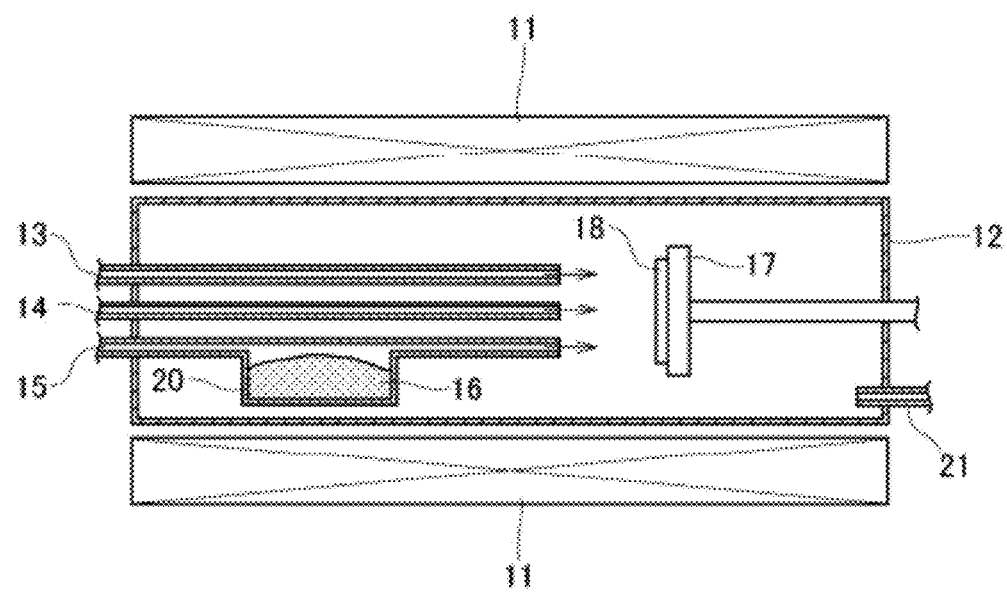
FIG. 4 is a schematic sectional view showing an HVPE apparatus for executing a manufacturing method of a nitride semiconductor crystal according to an embodiment of the present invention.

FIG. 4 shows a preferable example of the HVPE growth apparatus of the GaN substrate. This apparatus has a reaction tube 12 and a heater 11 provided around the reaction tube 12, and the reaction tube 12 has a substrate holder 17, in which a void formed substrate 18 is set, reactive gas inlet tubes 13, 15 opened in the vicinity of the void formed substrate 18, an etching gas inlet tube 14 opened in the vicinity of the void formed substrate 18, and an exhaust hole 21. A raw material placement chamber 20 having Ga metal 16 is provided in the reactive gas inlet tube 15.

$NH_3$ is fed to the reactive gas inlet tube 13, and HCl gas is fed to the reactive gas inlet tube 15. Preferably, these reactive gases are fed, together with carrier gas such as $H_2$ and $N_2$, etc. In the reactive gas inlet tube 15, Ga metal 16 and HCl placed in the raw material placement chamber 20 are reacted with each other, to thereby generate GaCl. Accordingly, GaCl and $NH_3$ are supplied to the void formed substrate 18 from the reactive gas inlet tubes 13, 15. GaCl and $NH_3$ are reacted with each other, to thereby vapor-phase grow GaN crystal on the void formed substrate 18. HCl gas for etching is supplied to the void formed substrate 18 by the etching gas inlet tube 14. In order to enlarge the individual initial nucleus, the supply of the HCl etching is performed continuously during the step of crystal growth, or is performed alternately with the step of crystal growth.

In a temperature decreasing process after end of the growth, a GaN thick film and a sapphire substrate are naturally separated from each other, to thereby obtain the GaN freestanding substrate.

[Control of the Warpage]

A difference in dislocation density is generated in the GaN substrate in a thickness direction from the rear surface (N-surface side) to the front surface (Ga surface side, namely, crystal growth surface side). Lattice constants are varied in the thickness direction, and the warpage is generated in the GaN substrate. In order to prevent the generation of the warpage, the difference in dislocation density in the rear surface and in the front surface is made to be uniform in the surface of the substrate. An initial nucleus density can be given as a control item for varying the dislocation density from the rear surface to the front surface. By making the initial nucleus density uniform in the surface of the substrate, the difference in dislocation density in the rear surface and in the front surface can be made uniform. In order to control the initial nucleus density, a gallium chloride (GaCl) gas flow rate is used. Then, the initial nucleus density can be made uniform by spreading GaCl uniformly in the surface of the substrate. As a method of spreading GaCl gas uniformly in the surface of the substrate, for example, there is a method for optimizing a mixing ratio of hydrogen gas ($H_2$) and nitrogen gas ($N_2$), being the carrier gas of the GaCl gas. This method is effective, because molecular weights are different between the $H_2$ gas and the $N_2$ gas, and therefore by changing the mixing ratio of the $H_2$ gas and the $N_2$ gas, hit of the GaCl gas against the substrate is changed.

[GaN Substrate of this Embodiment]

As described above, by controlling the warpage, the GaN freestanding substrate obtained after separation, becomes a substrate with less warpage.

According to the GaN freestanding substrate of this embodiment, when the line segment is drawn from one end of the substrate rear surface to the other end of the substrate rear surface passing through the center line of the substrate, and the substrate is sliced by this line segment in the thickness direction of the substrate, and when the maximum value of the shortest values of the distance from an arbitrary point on the drawn line segment to the rear side outline in the sliced surface, is defined warpage H in the diameter direction, the warpage H in the diameter direction is obtained in the peripheral direction of the substrate and when its maximum value is set to be Hmax, and its minimum value is set to be Hmin, the warpage H in the diameter direction is defined to satisfy Hmax−Hmin≦30 μm. Further, preferably the warpage H in the diameter direction is defined to satisfy Hmax−Hmin≦20 μm.

In order to form a semiconductor device such as a laser element and a light emitting diode or a high electron mobility transistor (HEMT) on the GaN freestanding substrate, after separation, the front surface and the rear surface are mirror-polished until the thickness is 400 μm. The nitride semiconductor thin film such as AlGaN for element is epitaxially-grown on the surface of the mirror-polished GaN substrate by the MOVPE method. The MOVPE growth apparatus is used therefore.

[MOVPE Growth Apparatus]

Figure 5:
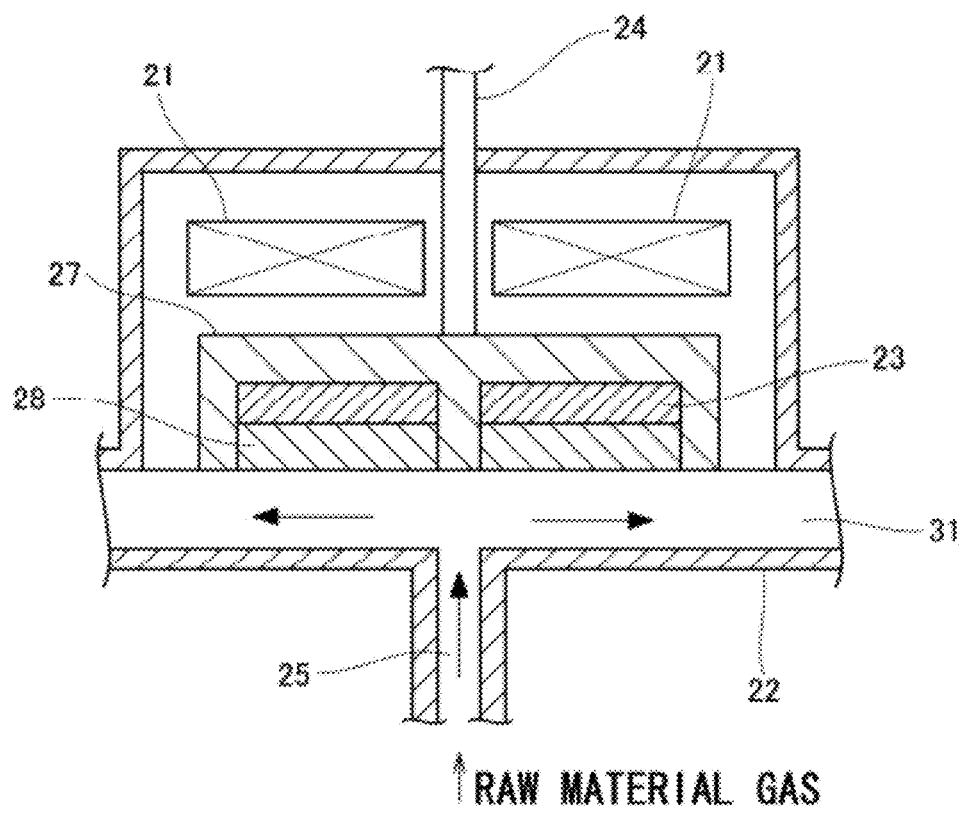
FIG. 5 is a schematic sectional view showing an MOVPE growth apparatus for executing the manufacturing method of the nitride semiconductor crystal according to an embodiment of the present invention.

FIG. 5 shows a preferable example of the MOVPE growth apparatus of a self-revolution type face-down system. This apparatus has a reaction tube 22. The reaction tube 22 includes: a disc-shaped substrate holder 27 to which a plurality of GaN substrates 28 are fitted; a rotary shaft 24 for rotating the substrate holder 27; a heater 21 for heating the substrate 28 through the substrate holder 27; a raw material inlet opening 25 for introducing a raw material gas into the reaction tube 22; and a gas discharge opening 31 for discharging gas. The substrate holder 27 carries out self-revolution by the rotation of the rotary shaft 24. The GaN substrate 28 is supported in the substrate holder 27, with the substrate surface faced downward. The GaN substrate 28 is designed, so that the substrate rear surface is brought into contact with a heat-soaking plate 23 in a state of being placed in the substrate holder 27. Carbon is used in the substrate holder 27, and SiC is used in the heat-soaking plate 23, respectively. The substrate holder 27 is given as a broad concept hereinafter, including the heat-soaking plate 23.

TMG, being an organic metal raw material, and $NH_3$, being a gas raw material, are fed into the reaction tube 22 from the raw material inlet opening 25. The $H_2$ gas and $N_2$ gas, being the carrier gas, are also fed thereto. TMG and $NH_3$ are reacted with each other in the reaction tube 22, and the GaN crystal is vapor phase-grown on the GaN substrate 28.

[Substrate Holder]

Figure 6:
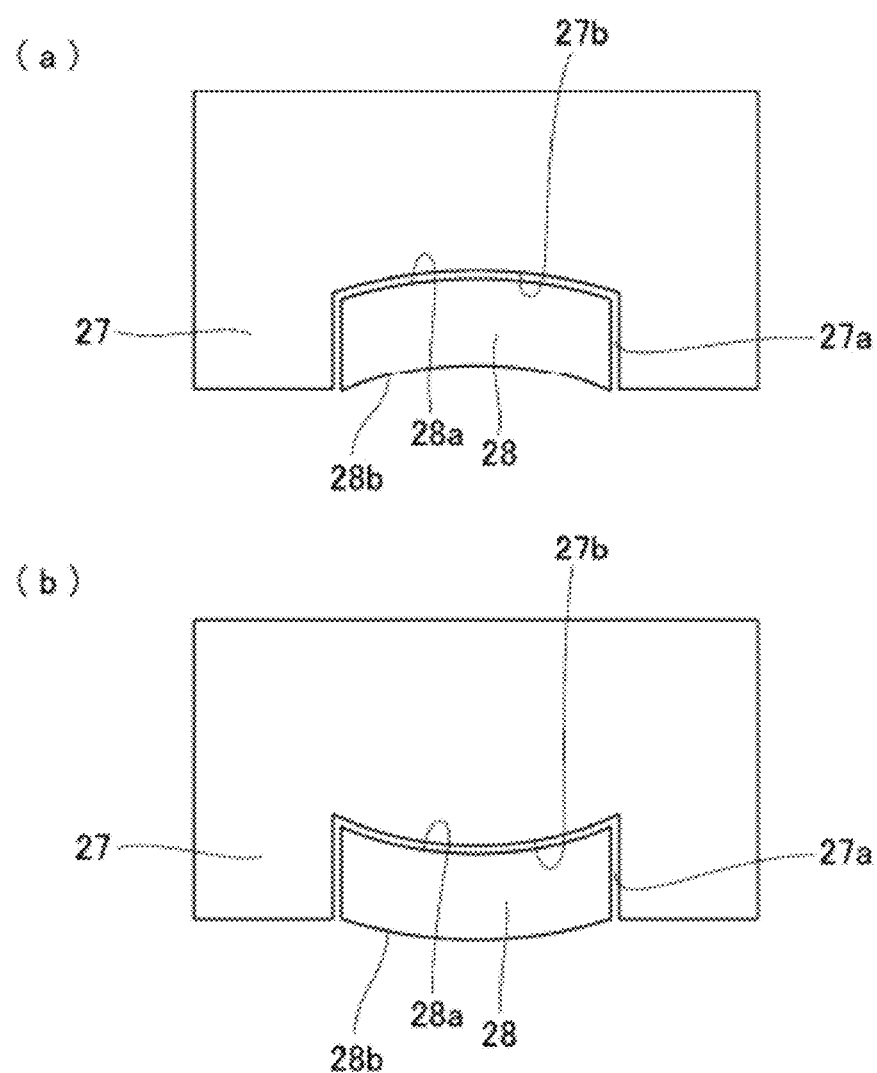

As shown in FIG. 6, the substrate holder 27 including the heat-soaking plate has a dent 27a for containing the GaN substrate on a horizontal surface. The GaN substrate 28 is fitted to this dent 27a, with the substrate rear surface 28a adhered thereto, and the substrate front surface 28b exposed. In the GaN substrate 28 fitted to the substrate holder 27, it is preferable to define the warpage H in the diameter direction, satisfying Hmax−Hmin≦30 μm. Also, it is further preferable that the warpage H in the diameter direction is defined to satisfy Hmax−Hmin≦20 μm. The warpage of a dent bottom part 27b of the substrate holder 27 at this time is formed into a uniform warpage shape symmetrical with respect to the center, and is set to be an average value of the warpage in the surface of the substrate rear surface.

Advantage of the Embodiment

According to this embodiment, in the warpage H in the diameter direction in the surface of the rear surface of the GaN substrate, by setting the difference between a maximum warpage Hmax in the diameter direction and a minimum warpage Hmin in the diameter direction to be 30 μm or less or preferably set to be 20 μm or less, and by using the substrate holder having a uniform warpage shape symmetrical with respect to the center (the warpage amount of the substrate holder at this time is set to be the average value of the warpage in the surface of the substrate rear surface), the adhesion of the substrate can be improved, and the temperature distribution in the surface of the substrate can be made uniform. Accordingly, the film thickness distribution and the characteristics such as a composition of a grown film can be made uniform, thus making it possible to improve the production yield of the device.

Example 1

The present invention will be described in further detail, using examples as follows. However, the present invention is not limited to these examples.

Example 1

The GaN base layer having a thickness of 300 nm was formed on the sapphire substrate having a diameter of 2.5 inch, by the MOVPE method using the MOVPE apparatus shown in FIG. 5. As growth conditions, trimethyl gallium (TMG) was used as the organic metal raw material, $NH_3$ gas was used as the gas raw material, and the $H_2$ gas and $N_2$ gas were used as the carrier gas.

Flow rate TMG: 100 sccm, $NH_3$: 30 liter/min, $H_2$: 75 liter/min, $N_2$: 50 liter/min
Temperature 1100° C.
Pressure 300 Torr
Growth time 3 minutes wherein, the substrate holder with no warpage was used, because the GaN layer was formed on the sapphire substrate with no warpage.

Ti having a thickness of 20 nm was deposited on the front surface of the GaN base layer, then heat treatment was applied thereto for 30 minutes at 1,000° C. in the mixture flow, to thereby manufacture the void formed substrate having a net-like TiN film (for example, see Japanese Patent Laid Open Publication No. 2003-178984).

The manufactured void formed substrate was set in the substrate holder 17 within the HVPE apparatus shown in FIG. 4, then inside of a reactor was set in a normal pressure, and the substrate temperature was heated up to 1,050° C. In this state, the initial nucleus was formed. Forming conditions of the initial nucleus are as follows. The $NH_3$ gas of $5\times10^{-2}$ atm was introduced from the reactive gas inlet tube 13 together with the $N_2$ gas of $6\times10^{-1}$ atm, being the carrier gas, and the GaCl gas of $5\times10^{-2}$ atm was introduced from the reactive gas inlet tube 15 together with the $N_2$ gas and $H_2$ gas, being the carrier gas. The growth time of the initial nucleus was 20 minutes. The partial pressure of the $N_2$ gas and $H_2$ gas, being the carrier gas of the GaCl gas, was varied as shown in table 1 respectively for each sample.

After forming the initial nucleus, the crystal growth was caused until an entire body of the GaN crystal was 600 μm under conditions of forming the initial nucleus, other than a point that the GaCl gas partial pressure was set to be $1.5\times10^{-2}$ atm, and the $N_2$ gas partial pressure, being the carrier gas of the $NH_3$ gas was set to be $5.85\times10^{-1}$ atm.

After forming the crystal, the sapphire substrate was separated from the GaN thick film at a boundary of a void, to thereby obtain the GaN substrate. The front surface and the rear surface (surface opposite side to the front surface) were mirror-surface polished, until the thickness of the GaN substrate was 400 μm. This GaN substrate had a convex warpage on the front side of the substrate, namely, on the crystal growth surface side (Ga surface side) of the substrate. After mirror-polishing, the warpage of the substrate on the rear surface of the substrate was measured by Flat Master 200 produced by Tropel. The measurement results, Hmax, Hmin, and Have are shown in table 1. Have indicates average values of the warpage H of the substrate in an entire surface of the substrate.

From table 1, it is found that by varying the mixing ratio of the partial pressure of the $N_2$ gas and $H_2$ gas, the difference between the Hmax and Hmin is varied, and there is an optimal mixing ratio of the partial pressure of the $N_2$ gas and $H_2$ gas for reducing the difference between the Hmax and the Hmin.

TABLE 1

| Sample No. | H2 gas partial pressure ($\times10^{-2}$ atm) | N2 gas partial pressure ($\times10^{-1}$ atm) | Warpage Hmax (μm) | Warpage Hmin (μm) | Hmax − Hmin (μm) | Warpage Have (μm) |
| --- | --- | --- | --- | --- | --- | --- |
| 1 | 4 | 3.1 | 39 | 3 | 36 | 21 |
| 2 | 5 | 3.0 | 36 | 6 | 30 | 21 |
| 3 | 6 | 2.9 | 33 | 9 | 24 | 21 |
| 4 | 7 | 2.8 | 31 | 11 | 20 | 22 |
| 5 | 8 | 2.7 | 29 | 14 | 15 | 22 |
| 6 | 9 | 2.6 | 27 | 17 | 10 | 21 |
| 7 | 10 | 2.5 | 25 | 20 | 5 | 22 |
| 8 | 11 | 2.4 | 27 | 18 | 9 | 22 |
| 9 | 12 | 2.3 | 30 | 15 | 15 | 22 |
| 10 | 13 | 2.2 | 32 | 12 | 20 | 21 |
| 11 | 14 | 2.1 | 34 | 10 | 24 | 21 |
| 12 | 15 | 2.0 | 37 | 7 | 30 | 22 |
| 13 | 16 | 1.9 | 40 | 5 | 35 | 22 |

Example 2

A single layer film was epitaxyally-grown by using the GaN substrate obtained in the example 1, and its film thickness distribution was examined.

By using the GaN substrate of samples No. 1 to 13, the single layer of AlGaN was grown by the MOVPE method using the MOVPE apparatus shown in FIG. 5. As the growth conditions, trimethyl gallium (TMG) and trimethyl aluminum (TMA) were used as organic metal raw materials, the $NH_3$ gas was used as the gas raw material, and the $H_2$ gas and $N_2$ gas were used as the carrier gas.

Flow rate TMG: 100 sccm, TMA: 100 sccm, $NH_3$: 30 liter/min, $H_2$: 75 liter/min, $N_2$: 50 liter/min, temperature: 1,000° C., Pressure: 300 Torr, Growth time 120 minutes.

Further, the substrate holder was set to have the warpage amount corresponding to the values of Have of each one of the samples No. 1 to 13, and the substrate holder having a uniform warpage shape symmetrical with respect to its center was used.

Figure 2:
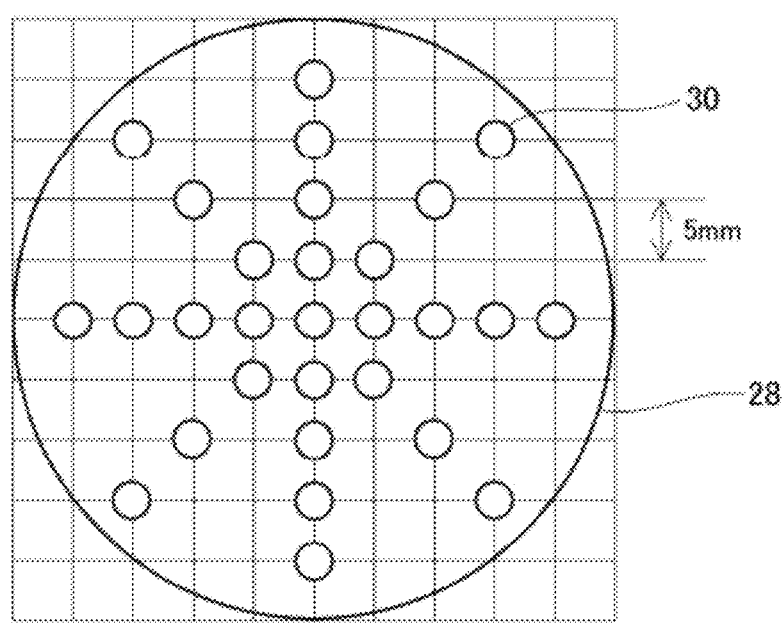
FIG. 2 is a planar view showing a front surface of the nitride semiconductor substrate explaining a film thickness measurement position of an AlGaN single layer by a spectrum ellipsometric method used in example 2 of the present invention.

The single layer of AlGaN having composition of $Al_{0.05}Ga_{0.95}N$ was grown. The film thickness after growth was measured at 29 points shown in FIG. 2 by a spectrum ellipsometry (produced by JOBIN YVON, model type: UVISEL). The film thickness of the single layer of AlGaN was measured and the position (measurement position) is shown by symbol 30. Measurement results are shown in the following table.

TABLE 2

| Sample No. | Hmax − Hmin (µm) | Standard deviation at 29 points of the film thickness of AlGaN single layer (µm) | Average film thickness at 29 points of the film thickness of AlGaN single layer (µm) | Standard deviation/average film thickness of AlGaN single layer (%) |
|---|---|---|---|---|
| 1 | 36 | 0.16 | 2.08 | 7.7% |
| 2 | 30 | 0.10 | 2.05 | 4.9% |
| 3 | 24 | 0.07 | 2.11 | 3.3% |
| 4 | 20 | 0.04 | 2.05 | 2.0% |
| 5 | 15 | 0.03 | 2.08 | 1.4% |
| 6 | 10 | 0.02 | 2.04 | 1.0% |
| 7 | 5 | 0.01 | 2.07 | 0.5% |
| 8 | 9 | 0.02 | 2.09 | 1.0% |
| 9 | 15 | 0.03 | 2.10 | 1.4% |
| 10 | 20 | 0.04 | 2.06 | 1.9% |
| 11 | 24 | 0.07 | 2.08 | 3.4% |
| 12 | 30 | 0.10 | 2.09 | 4.8% |
| 13 | 35 | 0.16 | 2.04 | 7.8% |

From the above-described evaluation results, it is found when the difference between Hmax and Hmin is smaller, the ratio of standard deviation/average film thickness is smaller and the film thickness distribution is smaller accordingly. Also, it is found that when the difference between Hmax and Hmin is within 30 µm, the ratio of the standard deviation/average film thickness is within 5.0% and is uniform. Further, when the difference between Hmax and Hmin is within 20 µm, the ratio of the standard deviation/average film thickness is within 2.0%, thus further uniformizing the film thickness distribution, and when the difference between Hmax and Hmin is greater than 30 µm, the ratio of the standard deviation/average film thickness is 5.0% or more and the film thickness distribution becomes non-uniform.

Therefore, according to this example, it is found that the difference between Hmax−Hmin can be set to be 5 µm or more and 30 µm or less, and the ratio of the standard deviation/average film thickness is within 4.9%, thereby uniformizing the film thickness distribution.

What is claimed is:

1. A nitride semiconductor substrate, wherein when a concave warpage is set to be negative on a substrate front side, and a convex warpage is set to be positive on the substrate front side, which is a crystal growth surface side of the substrate, then a line segment is drawn from one end of a substrate rear surface to an opposing end of the substrate rear surface, which is a surface opposite side to the substrate front side, passing through a substrate center line, and the substrate is sliced by this line segment in a substrate thickness direction, a maximum value of shortest values of a distance from an arbitrary point on the line segment to a rear side outline in a sliced surface, is defined as warpage H in a diameter direction, and when the warpage H in the diameter direction is obtained in a substrate peripheral direction, with its maximum value set to be Hmax, and its minimum value set to be Hmin in the warpage H in the diameter direction in the surface of the substrate rear surface, the warpage H in the diameter direction is defined to satisfy Hmax−Hmin≦30 µm.

2. The nitride semiconductor substrate according to claim 1, wherein the warpage H in the diameter direction is defined to satisfy Hmax−Hmin≦20 µm.

3. The nitride semiconductor substrate according to claim 1, wherein the nitride semiconductor substrate is a gallium nitride (GaN) substrate.

4. The nitride semiconductor substrate according to claim 1, wherein the nitride semiconductor substrate is a gallium nitride (GaN) freestanding substrate.

5. A nitride semiconductor substrate comprising:
a substrate front side, the substrate front side a crystal growth surface side; and
a substrate rear side, the substrate rear side an opposite side to the substrate front side, wherein a concave warpage is set to be negative on the substrate front side, a convex warpage is set to be positive on the substrate front side, and a line segment is drawn from one end of the substrate rear side to an opposing end of the substrate rear side, the line segment passing through a center line of the substrate and slicing the substrate in a substrate thickness direction, and a maximum value of shortest values of a distance from an arbitrary point on the line segment to a rear side outline in the sliced substrate, is defined as warpage H in a diameter direction, and when the warpage H in the diameter direction is obtained in a substrate peripheral direction, with its maximum value set to be Hmax, and its minimum value set to be Hmin in the warpage H in the diameter direction in the surface of the substrate rear side, the warpage H in the diameter direction is defined to satisfy Hmax−Hmin≦30 µm.

6. The nitride semiconductor substrate according to claim 5, wherein the warpage H in the diameter direction is defined to satisfy Hmax−Hmin≦20 µm.

7. The nitride semiconductor substrate according to claim 5, wherein the nitride semiconductor substrate is a gallium nitride (GaN) substrate.

8. The nitride semiconductor substrate according to claim 5, wherein the nitride semiconductor substrate is a gallium nitride (GaN) freestanding substrate.

* * * * *